(12) United States Patent
Wang et al.

(10) Patent No.: US 12,041,822 B2
(45) Date of Patent: Jul. 16, 2024

(54) DISPLAY PANEL AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Dongfang Wang, Beijing (CN); Qinghe Wang, Beijing (CN)

(73) Assignees: HEFEI XINSHENG OPTOELECTRONICS CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 383 days.

(21) Appl. No.: 17/600,556

(22) PCT Filed: Nov. 20, 2020

(86) PCT No.: PCT/CN2020/130590
§ 371 (c)(1),
(2) Date: Sep. 30, 2021

(87) PCT Pub. No.: WO2021/104177
PCT Pub. Date: Jun. 3, 2021

(65) Prior Publication Data
US 2022/0173192 A1    Jun. 2, 2022

(30) Foreign Application Priority Data
Nov. 28, 2019   (CN) .......................... 201911191964.8

(51) Int. Cl.
*H10K 59/121*   (2023.01)
*H10K 59/38*    (2023.01)

(52) U.S. Cl.
CPC ......... *H10K 59/1216* (2023.02); *H10K 59/38* (2023.02)

(58) Field of Classification Search
USPC .......................................................... 257/71
See application file for complete search history.

(56) References Cited

U.S. PATENT DOCUMENTS

| | | | |
|---|---|---|---|
| 11,610,922 B2 * | 3/2023 | Zhou ................... | H01L 27/1225 |
| 11,631,723 B2 * | 4/2023 | Moon .................. | H10K 71/166 |
| | | | 257/88 |

(Continued)

FOREIGN PATENT DOCUMENTS

| | | |
|---|---|---|
| CN | 102201189 A | 9/2011 |
| CN | 102931359 A | 2/2013 |

(Continued)

OTHER PUBLICATIONS

The First Office Action of Priority Application No. CN 201911191964.8 issued by the Chinese Patent Office on Oct. 9, 2021.

(Continued)

*Primary Examiner* — Bo B Jang
(74) *Attorney, Agent, or Firm* — IP & T GROUP LLP

(57) ABSTRACT

A display panel having a pixel region includes a base substrate, a plurality of pixel circuits located in the pixel region, and a plurality of light-emitting structures located in the pixel region. Each pixel circuit includes a storage capacitor and a plurality of transistors. The light-emitting structures are configured to emit light of at least three primary colors. Each light-emitting structure includes a light-emitting device. Each pixel circuit is coupled to the light-emitting device in a corresponding light-emitting structure, and a surface of the light-emitting device proximate to the base substrate is a light exit surface. Among the light-emitting structures, an orthogonal projection of an effective light-emitting region, on the base substrate, of the (Continued)

light-emitting device in a first light-emitting structure with a shortest light-emitting wavelength, is spaced apart from orthogonal projections of all storage capacitors of the plurality of pixel circuits on the base substrate.

17 Claims, 11 Drawing Sheets

(56) References Cited

U.S. PATENT DOCUMENTS

| | | |
|---|---|---|
| 2010/0096988 A1 | 4/2010 | Kitabayashi et al. |
| 2011/0234646 A1 | 9/2011 | Han et al. |
| 2013/0037817 A1 | 2/2013 | Lee et al. |
| 2015/0090985 A1 | 4/2015 | Park et al. |
| 2016/0125789 A1 | 5/2016 | Choi et al. |
| 2018/0183008 A1 | 6/2018 | Song et al. |
| 2018/0365471 A1 | 12/2018 | Xin et al. |
| 2021/0183977 A1 | 6/2021 | Xiao et al. |
| 2021/0225957 A1 | 7/2021 | Song et al. |
| 2021/0233971 A1 | 7/2021 | Yuan et al. |

FOREIGN PATENT DOCUMENTS

| | | |
|---|---|---|
| CN | 104362166 A | 2/2015 |
| CN | 104518001 A | 4/2015 |
| CN | 108242217 A | 7/2018 |
| CN | 108764081 A | 11/2018 |
| CN | 109166896 A | 1/2019 |
| CN | 109585520 A | 4/2019 |
| CN | 109817672 A | 5/2019 |
| CN | 110098243 A | 8/2019 |
| CN | 110890408 A | 3/2020 |

OTHER PUBLICATIONS

The Second Office Action of Priority Application No. CN 201911191964.8 issued by the Chinese Patent Office on Feb. 17, 2022.

* cited by examiner

DISPLAY PANEL AND DISPLAY APPARATUS

CROSS-REFERENCE TO RELATED APPLICATIONS

This application is a national phase entry under 35 USC 371 of International Patent Application No. PCT/CN2020/130590, filed on Nov. 20, 2020, which claims priority to Chinese Application No. 201911191964.8, filed on Nov. 28, 2019, which are incorporated herein by reference in their entirety.

TECHNICAL FIELD

The present disclosure relates to the field of display technologies, and in particular, to a display panel and a display apparatus.

BACKGROUND

An organic light-emitting diode (OLED) is widely used in a product or component with a display function such as a computer and a mobile phone due to the advantages of self-luminescence, high color saturation, and high contrast.

SUMMARY

In an aspect, a display panel is provided. The display panel has a pixel region. The display panel includes a base substrate, a plurality of pixel circuits disposed on the base substrate and located in the pixel region, and a plurality of light-emitting structures disposed in the pixel region and located on a side of the plurality of pixel circuits away from the base substrate. Each pixel circuit includes a storage capacitor and a plurality of transistors. The plurality of light-emitting structures are configured to emit light of at least three primary colors. Each light-emitting structure includes a light-emitting device, each pixel circuit is coupled to the light-emitting device in a corresponding light-emitting structure, and a surface of the light-emitting device proximate to the base substrate is a light exit surface. Among the plurality of light-emitting structures, an orthogonal projection of an effective light-emitting region, on the base substrate, of the light-emitting device in a first light-emitting structure with a shortest light-emitting wavelength, is spaced apart from orthogonal projections of all storage capacitors of the plurality of pixel circuits on the base substrate.

In some embodiments, an orthogonal projection of the storage capacitor, on the base substrate, of any other pixel circuit in the plurality of pixel circuits other than a first pixel circuit coupled to the light-emitting device in the first light-emitting structure, is at least partially overlapped with at least one orthogonal projection of at least one effective light-emitting region, on the base substrate, of at least one light-emitting device in at least one of the plurality of light-emitting devices other than the first light-emitting structure.

In some embodiments, the orthogonal projection of the storage capacitor, on the base substrate, of any other pixel circuit in the plurality of pixel circuits other than the first pixel circuit, is located within a range of an orthogonal projection of an effective light-emitting region, on the base substrate, of the light-emitting device in one of the plurality of light-emitting structures other than the first light-emitting structure.

In some embodiments, the pixel region includes a non-light-emitting region and a light-emitting region. The plurality of light-emitting structures are located in the light-emitting region. The first pixel circuit and the plurality of transistors of each of other pixel circuits in the plurality of pixel circuits other than the first pixel circuit are located in the non-light-emitting region.

In some embodiments, an orthogonal projection of the storage capacitor of the first pixel circuit on the base substrate is at least partially overlapped with orthogonal projections of the plurality of transistors of the first pixel circuit on the base substrate.

In some embodiments, an orthogonal projection of the storage capacitor of the first pixel circuit on the base substrate, is located within the range of the orthogonal projection of the effective light-emitting region, on the base substrate, of the light-emitting device in one of the plurality of light-emitting structures other than the first light-emitting structure.

In some embodiments, the pixel region includes a non-light-emitting region, a first light-emitting region, and a second light-emitting region. The first light-emitting region is located between the non-light-emitting region and the second light-emitting region. The plurality of light-emitting structures further include a second light-emitting structure and a third light-emitting structure in addition to the first light-emitting structure. The plurality of pixel circuits further include a second pixel circuit and a third pixel circuit in addition to the first pixel circuit. The second pixel circuit is coupled to the light-emitting device in the second light-emitting structure, and the third pixel circuit is coupled to the light-emitting device in the third light-emitting structure. The first light-emitting structure and the second light-emitting structure are located in the second light-emitting region, and the third light-emitting structure is located in the first light-emitting region. The storage capacitor of the first pixel circuit is located in the first light-emitting region. The plurality of transistors of each of the first pixel circuit, the second pixel circuit, and the third pixel circuit are located in the non-light-emitting region.

In some embodiments, the storage capacitor of the second pixel circuit is located in the second light-emitting region, and the storage capacitor of the third pixel circuit is located in the first light-emitting region.

In some embodiments, both the storage capacitor of the second pixel circuit and the storage capacitor of the third pixel circuit are located in the first light-emitting region.

In some embodiments, the plurality of light-emitting structures further include a fourth light-emitting structure. The first light-emitting structure, the second light-emitting structure, and the fourth light-emitting structure are configured to emit light of three primary colors, and the third light-emitting structure is configured to emit white light. The plurality of pixel circuits further include a fourth pixel circuit. The fourth pixel circuit is coupled to the light-emitting device in the fourth light-emitting structure. The fourth light-emitting structure is located in the second light-emitting region, and the plurality of transistors of the fourth pixel circuit are located in the non-light-emitting region.

In some embodiments, the storage capacitor of the third pixel circuit is located in the first light-emitting region. The storage capacitor of the second pixel circuit and the storage capacitor of the fourth pixel circuit are located in the second light-emitting region.

In some embodiments, the storage capacitor of the second pixel circuit, the storage capacitor of the third pixel circuit, and the storage capacitors of the fourth pixel circuit are located in the first light-emitting region.

In some embodiments, the pixel region includes a non-light-emitting region, a first light-emitting region, and a second light-emitting region. The first light-emitting region is located between the non-light-emitting region and the second light-emitting region. The plurality of light-emitting structures further include a second light-emitting structure and a third light-emitting structure in addition to the first light-emitting structure. The plurality of pixel circuits further include a second pixel circuit and a third pixel circuit in addition to the first pixel circuit. The second pixel circuit is coupled to the light-emitting device in the second light-emitting structure, and the third pixel circuit is coupled to the light-emitting device in the third light-emitting structure. The first light-emitting structure is located in the first light-emitting region, and both the second light-emitting structure and the third light-emitting structure are located in the second light-emitting region. The storage capacitor of the first pixel circuit, the storage capacitor of the second pixel circuit, and the storage capacitor of the third pixel circuit are located in the second light-emitting region. The plurality of transistors of each of the first pixel circuit, the second pixel circuit, and the third pixel circuit are located in the non-light-emitting region.

In some embodiments, the plurality of light-emitting structures further include a fourth light-emitting structure. The first light-emitting structure, the second light-emitting structure, the third light-emitting structure are configured to emit light of three primary colors, and the fourth light-emitting structure is configured to emit white light. The plurality of pixel circuits further include a fourth pixel circuit. The fourth pixel circuit is coupled to the light-emitting device in the fourth light-emitting structure. The fourth light-emitting structure and the storage capacitor of the fourth pixel circuit are located in the second light-emitting region. The plurality of transistors of the fourth pixel circuit are located in the non-light-emitting region.

In some embodiments, the first light-emitting structure is configured to emit blue light. Or, each light-emitting structure further includes a filter portion disposed on a light exit surface side of the light-emitting device. The light-emitting device in the first light-emitting structure is configured to emit white light, and the filter portion in the first light-emitting structure is configured to transmit blue light.

In some embodiments, the storage capacitor includes a first transparent electrode layer and a second transparent electrode layer that are insulated from each other. The first transparent electrode layer is closer to the base substrate than the second transparent electrode layer. Each transistor includes an active layer, and a material of the active layer includes a semiconductor material. The first transparent electrode layer of the storage capacitor and at least one active layer of at least one transistor are arranged in a same layer, and the first transparent electrode layer is obtained by conducting the semiconductor material.

In some embodiments, the storage capacitor further includes a third transparent electrode layer. The third transparent electrode layer is closer to the base substrate than the first transparent electrode layer. The third transparent electrode layer and the first transparent electrode layer are insulated from each other. The third transparent electrode layer is coupled to the second transparent electrode layer.

In some embodiments, the display panel further comprises a plurality of light shielding portions. Each light-shielding portion is located on a side of the active layer of the transistor facing the base substrate.

In some embodiments, the light shielding portion includes a transparent conductive sub-portion and a metal sub-portion that are stacked in a thickness direction of the base substrate. The third transparent electrode layer and the transparent conductive sub-portion are arranged in a same layer.

In another aspect, a display apparatus is provided. The display apparatus includes the display panel described above.

BRIEF DESCRIPTION OF THE DRAWINGS

In order to describe technical solutions in embodiments of the present disclosure or the prior art more clearly, accompanying drawings to be used in some embodiments of the present disclosure or the prior art will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product involved in the embodiments of the present disclosure.

DETAILED DESCRIPTION

Figure 1:
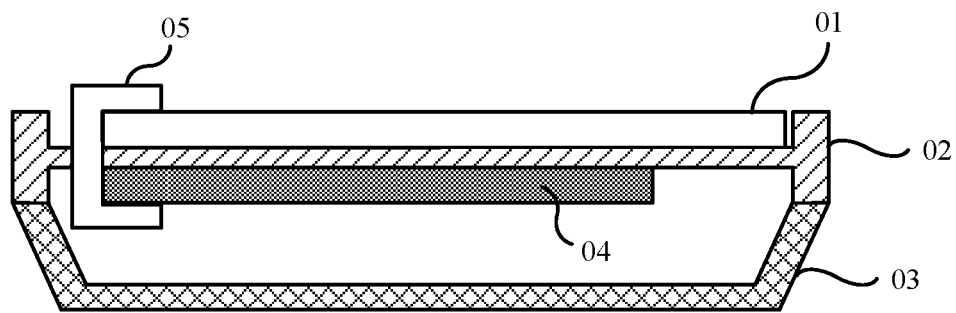
FIG. 1 is a schematic structural diagram of a display apparatus, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "some embodiments", "an example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features.

As used herein, the singular forms "a" and "an" include the plural form unless the context clearly dictates otherwise. In the description of the embodiments of the present disclosure, the term "a plurality of/the plurality of" means two or more unless otherwise specified.

In the description of some embodiments, orientations or positional relationships indicated by the terms such as "upper", "lower", "left" and "right" are on a basis of orientations or positional relationships shown in the drawings. They are used merely for convenience of description and simplifying the description of the present disclosure, but not to indicate or imply that the indicated apparatus or element must have a specific orientation, or be constructed or operated in a specific orientation, therefore cannot be construed as a limitation of the present disclosure.

In the description of some embodiments, the terms "coupled" and "connected" and their derivatives may be used. For example, the term "connected" may be used in the description of some embodiments to indicate that two or more components are directly or indirectly connected to each other. For another example, the term "coupled" may be used in the description of some embodiments to indicate that two or more components are in direct physical contact or electrical contact with each other. However, the term "coupled" may also mean that two or more components are not in direct contact with each other, but still cooperate or interact with each other. The embodiments disclosed herein are not necessarily limited to the content herein.

The phrase "at least one of A, B and C" includes the following combinations of A, B and C: only A, only B, only C, a combination of A and B, a combination of A and C, a combination of B and C, and a combination of A, B and C.

The use of "configured to" herein means an open and inclusive expression, which does not exclude devices that are applicable to or configured to perform additional tasks or steps.

In addition, the use of "based on" is meant to be open and inclusive, since a process, step, calculation or other action that is "based on" one or more of the stated conditions may, in practice, be based on additional conditions.

Exemplary embodiments are described herein with reference to sectional views and/or plan views as idealized exemplary drawings. In the accompanying drawings, thicknesses of layers and regions are enlarged for clarity. Therefore, the exemplary embodiments should not be construed to be limited to the shapes of regions shown herein, but to include deviations in the shapes due to, for example, manufacturing. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. The display apparatus may be used as a product or a component with any display function such as a mobile phone, a tablet computer, a television, a desktop computer, a smart wearable product (e.g., a smart watch and a smart bracelet), a personal digital assistant (PDA), an on-vehicle computer. The application of the display apparatus is not particularly limited in the embodiments of the present disclosure.

In some embodiments, as shown in FIG. 1, the display apparatus includes a display panel 01, a middle frame 02 for bearing the display panel 01, a housing 03 located on a side of the middle frame 02 away from the display panel 01, a circuit board 04 provided between the middle frame 02 and the housing 03, and a flexible printed circuit (FPC) 05 for connecting the display panel 01 and the circuit board 04. Of course, the display apparatus may include more or fewer components, and relative positions of these components may be changed.

The display panel 01 is configured to display an image. In some examples, the display panel 01 is an organic light-emitting diode (OLED) display panel. The OLED display panel includes a plurality of OLED devices. The OLED device may realize self-luminescence, and thus in a display apparatus including the OLED display panel, a backlight is not required.

For example, a section of the middle frame 02 is in a shape of a Chinese character " 工 ". The display panel 01 is provided on a side of the middle frame 02. The circuit board 04 is provided on another side of the middle frame 02, and the circuit board 04 is located in a cavity enclosed by the another side of the middle frame 02 and the housing 03. An end of the flexible printed circuit 05 is bonded to an edge of the display panel 01, and another end of the flexible printed circuit 05 extends into the cavity, and is bonded to the circuit board 04.

In some examples, the flexible printed circuit 05 includes a flexible printed circuit body and at least one driving chip disposed on the flexible printed circuit body. The driving chip may be a driving integrated circuit (IC). For example, the at least one driving chip includes at least one data driving IC.

The circuit board 04 is configured to supply signals necessary for display to the display panel 01. For example, the circuit board 04 is a printed circuit board assembly (PCBA). The PCBA includes a printed circuit board (PCB), a timing controller (TCON) disposed on the PCB, a power management integrated circuit (PMIC), and other ICs or circuits.

Figure 2:
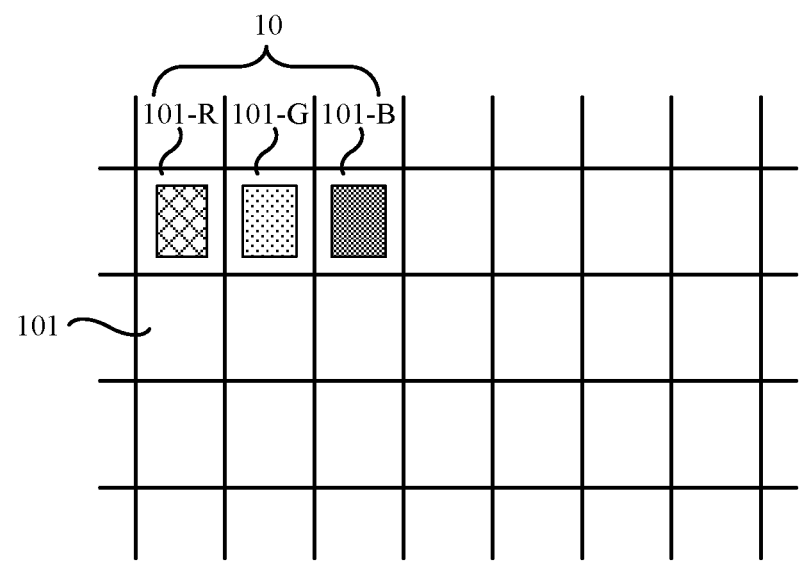
FIG. 2 is a schematic diagram of a pixel region of a display panel, in accordance with some embodiments of the present disclosure.
Figure 3A:
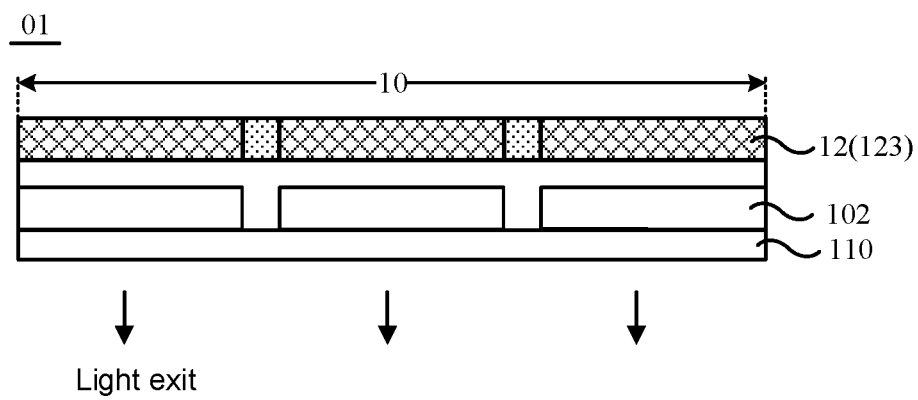
FIG. 3A is a schematic structural diagram of a display panel, in accordance with some embodiments of the present disclosure.
Figure 3B:
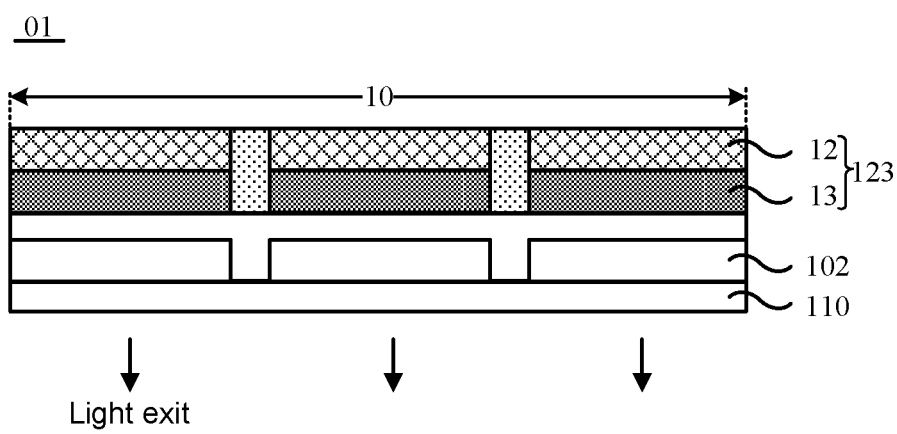
FIG. 3B is a schematic structural diagram of another display panel, in accordance with some embodiments of the present disclosure.

Some embodiments of the present disclosure provide the display panel 01. As shown in FIG. 2, the display panel 01 has a pixel region 10. As shown in FIGS. 3A and 3B, the display panel 01 includes a base substrate 110, and both a plurality of pixel circuits 102 and a plurality of light-emitting structures 123 disposed on the base substrate 110 and located in the pixel region 10. In some examples, the display panel 01 has a plurality of pixel regions 10, and each pixel region 10 is provided with the plurality of pixel circuits 102 and the plurality of light-emitting structures 123.

As shown in FIGS. 3A and 3B, in the pixel region 10, the plurality of light-emitting structures 123 are provided on a side of the plurality of pixel circuits 102 away from the base substrate 110. The plurality of light-emitting structures 123 are configured to emit light of at least three primary colors. Each light-emitting structure 123 includes a light-emitting device 12. Each pixel circuit 102 is coupled to the light-emitting device 12 in a corresponding light-emitting structure 123, and a surface of the light-emitting device 12 proximate to the base substrate 110 is a light exit surface (that is, the light-emitting device 12 is a bottom emission light-emitting device).

In some embodiments, as shown in FIG. 2, the pixel region 10 includes at least three sub-pixel regions 101, and each light-emitting structure 123 is provided in one sub-pixel region 101. In some examples, the pixel region 10 includes three sub-pixel regions 101. In an example where the three primary colors are red, green, and blue, respectively, as shown in FIG. 2, the three sub-pixel regions 101 are referred to as a red sub-pixel region 101-R, a green sub-pixel region 101-G, and a blue sub-pixel region 101-B, respectively. The light-emitting device 12 located in the red sub-pixel region 101-R is configured to emit red light, the light-emitting device 12 located in the green sub-pixel region 101-G is configured to emit green light, and the light-emitting device 12 located in the blue sub-pixel region 101-B is configured to emit blue light. In addition, in some other examples, the pixel region 10 further includes another sub-pixel region 101. The light-emitting device 12 located in the another sub-pixel region 101 is configured to emit white light.

It will be noted that the three primary colors may also be cyan, magenta, and yellow, respectively. The following description is made in the example where the three primary colors are red, green, and blue, respectively, and in an example where a light-emitting device 12-1 in a first light-emitting structure is configured to emit blue light.

In some embodiments, the light-emitting device 12 is an OLED device, and light emitted from the light-emitting device 12 exits toward the base substrate 110. Based on this, the display panel 01 in some embodiments of the present disclosure is a bottom emission OLED display panel.

Figure 4:
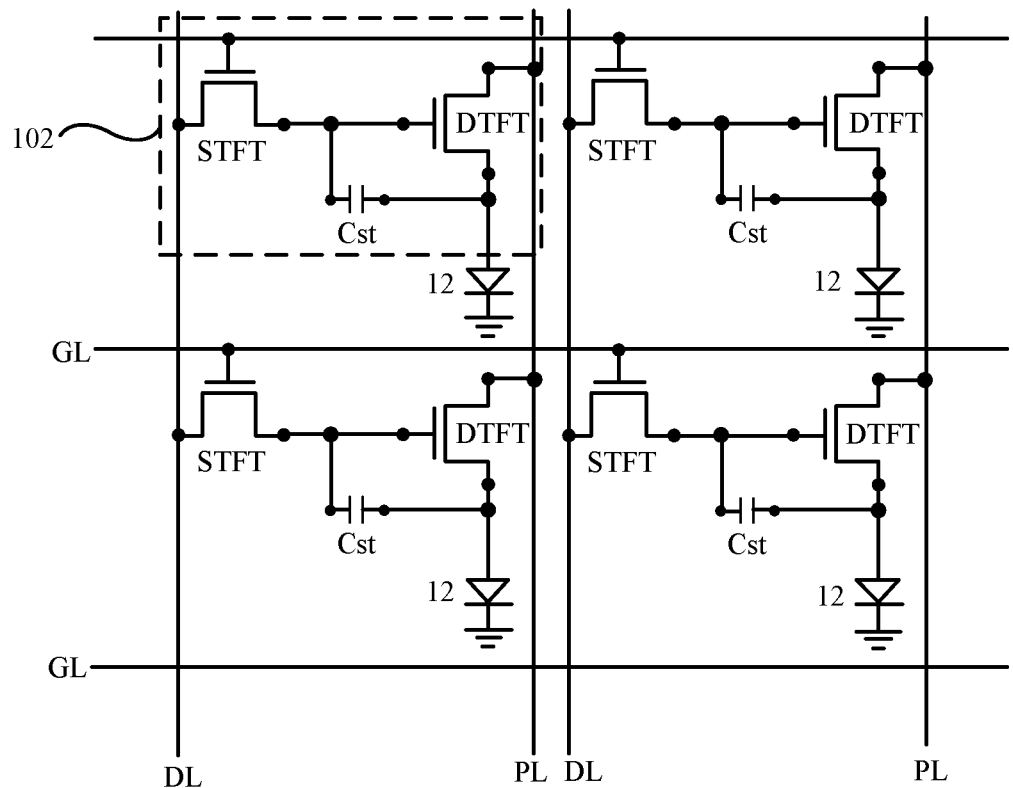
FIG. 4 is a circuit structure diagram of a pixel circuit, in accordance with some embodiments of the present disclosure.

As shown in FIG. 4, each pixel circuit 102 includes a storage capacitor Cst and a plurality of transistors. As shown in FIGS. 7A to 7D, among the plurality of light-emitting structures 123, an orthogonal projection of an effective light-emitting region, on the base substrate 110, of the light-emitting device 12-1 in the first light-emitting structure with a shortest light-emitting wavelength, is spaced apart from orthogonal projections of all the storage capacitors Cst of the plurality of pixel circuits 102 on the base substrate 110. Here, spacing apart means that the orthogonal projection of the effective light-emitting region of the light-emitting device 12-1 on the base substrate 110 is not overlapped with the orthogonal projections of all the storage capacitors Cst on the base substrate 110. It will be understood that the first light-emitting structure is one of the plurality of light-emitting structures 123, and the orthogonal projection of the effective light-emitting region of the light-emitting device 12-1 in the first light-emitting structure on the base substrate 110 is not overlapped with the orthogonal projection of the storage capacitor Cst of the pixel circuit 102 coupled to the light-emitting device 12-1 on the base substrate 110, and is also not overlapped with the orthogonal projections of the storage capacitors Cst of other pixel circuits 102 on the base substrate 110.

In an example where the light-emitting device 12 located in the red sub-pixel region 101-R is configured to emit red light, the light-emitting device 12 located in the green sub-pixel region 101-G is configured to emit green light, and the light-emitting device 12 located in the blue sub-pixel region 101-B is configured to emit blue light, since a wavelength of blue light is shortest, the light-emitting structure 123 located in the blue sub-pixel region 101-B is the first light-emitting structure. That is, the light-emitting device 12-1 in the first light-emitting structure is configured to emit blue light.

In addition, it is understood for a person skilled in the art that since the light-emitting device 12 is the bottom emission light-emitting device, and the transistor includes an opaque metal structure, an orthogonal projection of an effective light-emitting region of any light-emitting device 12 on the base substrate 110 is not overlapped with orthogonal projections of the plurality of transistors of the pixel circuit 102 coupled to the light-emitting device 12 on the base substrate 110.

The pixel circuit 102 is configured to drive the light-emitting device 12 coupled to the pixel circuit 102 to emit light. In some embodiments, the pixel circuit 102 is of a 2T1C structure. That is, the pixel circuit 102 includes two transistors and one capacitor, and an equivalent circuit of the pixel circuit 102 is shown in FIG. 4. As shown in FIG. 4, the pixel circuit 102 includes a switch thin film transistor (STFT), a driver thin film transistor (DTFT), and the storage capacitor Cst. A gate of the switch thin film transistor STFT is connected to a gate line GL, a first electrode of the switch thin film transistor STFT is connected to a data line DL, and a second electrode of the switch thin film transistor STFT is connected to a gate of the driver thin film transistor DTFT. A first electrode of the driver thin film transistor DTFT is connected to a power line PL, and a second electrode of the driver thin film transistor DTFT is connected to the light-emitting device 12. A terminal of the storage capacitor Cst is connected to the gate of the driver thin film transistor DTFT, and another terminal of the storage capacitor Cst is connected to the second electrode of the driver thin film transistor DTFT. In some examples, the second electrode of the driver thin film transistor DTFT is connected to an anode of the light-emitting device 12, and a cathode of the light-emitting device 12 is connected to a common voltage line. For example, the common voltage line is a ground line.

Based on this, as shown in FIG. 4, by applying gate driving signals to the gate lines GL sequentially, the switch thin film transistors STFT located in the pixel regions 10 in rows are turned on row by row. A data signal from the data line DL is input to the gate of the driver thin film transistor DTFT through the switch thin film transistor STFT that is turned-on, so that the driver thin film transistor DTFT is turned on. A power supply signal from the power line PL is transmitted to the driver thin film transistor DTFT, so that the driver thin film transistor DTFT outputs a driving signal according to the power supply signal and the data signal to the light-emitting device 12, so as to make the light-emitting device 12 emit light. In the above process, the data line DL charges the storage capacitor Cst, so that the driver thin film transistor DTFT is kept turned on by using electric energy stored in the storage capacitor Cst, so as to maintain a duration required for one frame display.

It will be noted that for each transistor, one of a first electrode and a second electrode is a source, and another one is a drain. In the pixel driving circuit 102, a width-length ratio of a channel of the driver thin film transistor DTFT is greater than a width-length ratio of a channel of the switch thin film transistor STFT.

In addition, the above description is made considering the pixel circuit 102 of the 2T1C structure as an example, but the circuit structure of the pixel circuit 102 in the embodiments of the present disclosure is not limited thereto. For example, the pixel circuit 102 may also be of a 3T1C circuit structure (the 3T1C circuit structure includes three transistors and one capacitor), a 6T1C circuit structure (the 6T1C circuit structure includes six transistors and one capacitor), a 7T1C circuit structure (the 7T1C circuit structure includes seven transistors and one capacitor), or other types of pixel circuits. The 3T1C circuit structure, the 6T1C circuit structure, and the 7T1C circuit structure may realize a threshold voltage compensation of the driver thin film transistor DTFT and an initialization function of the gate of the driver thin film transistor DTFT. The 7T1C circuit structure may further realize an initialization function of the anode of the light-emitting device 12. However, no matter what circuit structure the pixel circuit 102 has, it at least includes one driver thin film transistor DTFT, one switch thin film transistor STFT, and one storage capacitor Cst.

Figure 5:
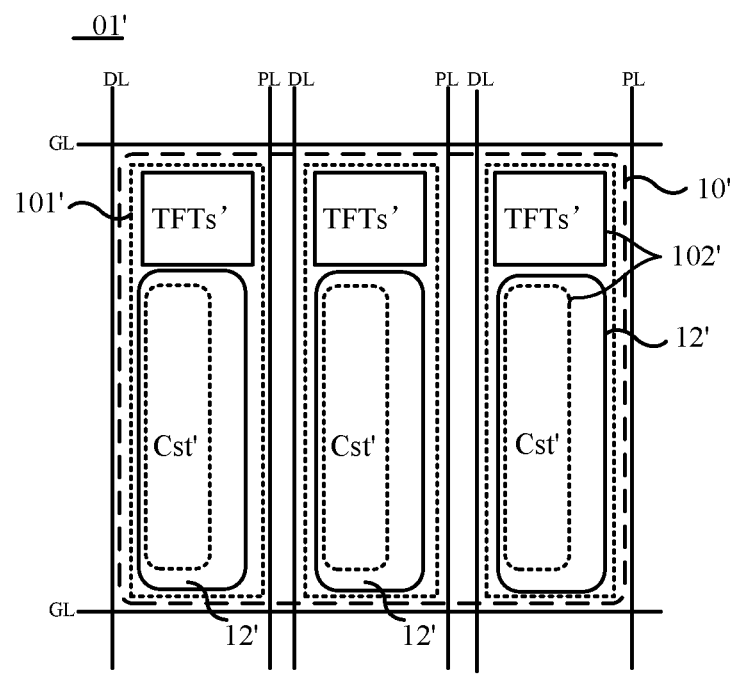
FIG. 5 is a schematic structural diagram of a display panel in the related art.

In the related art, as shown in FIG. 5, a pixel region 10' of a display panel 01' includes a plurality of sub-pixel regions 101'. Each sub-pixel region 101' is provided with a light-emitting device 12' and a pixel circuit 102' coupled to the light-emitting device 12'. The pixel circuit 102' includes a storage capacitor Cst' and a plurality of transistors TFTs'. An orthogonal projection of the storage capacitor Cst' in each sub-pixel region 101' on a base substrate 110' is located within a range of an orthogonal projection of an effective light-emitting region of the light-emitting device 12' in the sub-pixel region 101' on the base substrate 110'. The storage capacitor Cst' includes two transparent electrodes that are insulated from each other and stacked in a thickness direction of the base substrate 110'. In this case, for a bottom emission OLED display panel, a surface of the light-emitting device 12' proximate to the base substrate 110' is a light exit surface. Therefore, light emitted from the light-emitting device 12' in each sub-pixel region 101' is required to pass through the storage capacitor Cst', and then exit from the base substrate 110'. In this way, the transparent electrodes of the storage capacitor Cst' reduce a transmittance of light.

Figure 6:
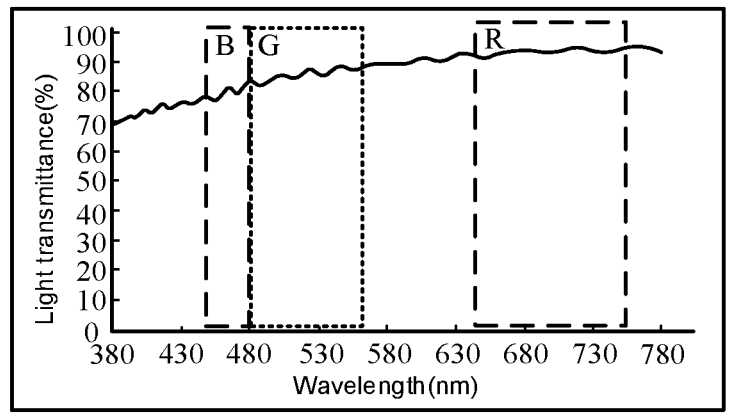
FIG. 6 is a schematic diagram of a transmittance of light varying with wavelength.

In addition, as shown in FIG. 6, the shorter the wavelength of light, the lower the transmittance of light through the storage capacitor Cst'. For example, a transmittance of blue light B in a wavelength range of 450 to 480 nm is approximately 85%, a transmittance of green light G in a wavelength range of 480 to 550 nm is approximately 90%, and a transmittance of red light R in a wavelength range of 640 to 750 nm is approximately 95%.

The storage capacitor Cst' reduces a transmittance of light with a short wavelength, and may ensure a required brightness for display by increasing an operating current of a corresponding light-emitting device 12' and the increase in the operating current of the light-emitting device 12' reduces the lifetime of the light-emitting device 12'.

In the display panel 01 provided by some embodiments of the present disclosure, among the plurality of light-emitting structures 123, the light-emitting device 12-1 in the first light-emitting structure has a shortest light-emitting wavelength. The orthogonal projection of the effective light-emitting region of the light-emitting device 12-1 in the first light-emitting structure on the base substrate 110, is spaced apart from the orthogonal projections of all the storage capacitors Cst of the plurality of pixel circuits 102 on the base substrate 110. In this way, light emitted from the light-emitting device 12-1 in the first light-emitting structure may exit from the base substrate 110 without passing through the storage capacitor Cst. Therefore, the problem of the storage capacitor Cst reducing the transmittance of light does not occur, and thus a light-emitting brightness of the display panel 01 may be ensured without increasing an operating current of the light-emitting device 12-1 in the first light-emitting structure, which is beneficial to prolong the lifetime of the light-emitting device 12-1 in the first light-emitting structure.

In some embodiments, as shown in FIGS. 7A to 7D, the orthogonal projection of the storage capacitor Cst, on the base substrate 110, of any other pixel circuit 102 in the plurality of pixel circuits 102 other than a first pixel circuit 102-1 coupled to the light-emitting device 12-1 in the first light-emitting structure, is at least partially overlapped with orthogonal projection(s) of effective light-emitting region(s), on the base substrate 110, of the light-emitting device(s)

12 in at least one of the plurality of light-emitting devices 123 other than the first light-emitting structure 123.

As described above, when the light emitted from the light-emitting device 12-1 in the first light-emitting structure with the shortest light-emitting wavelength passes through the storage capacitor Cst, the transmittance is greatly affected. Other light-emitting structures 123 in the plurality of light-emitting structures 123 other than the first light-emitting structure 123 have a relatively long light-emitting wavelength. Therefore, even if light emitted from the other light-emitting structures 123 passes through the storage capacitor Cst, the transmittance is not greatly affected. On this basis, the storage capacitor Cst of the any other pixel circuit 102 and the light-emitting device(s) 12 in at least one of the other light-emitting structures 123 are arranged in a same region, which may ensure light-emitting areas of the light-emitting devices 12 in the other light-emitting structures 123 in a case where an area of the pixel region 10 is limited, so as to ensure a corresponding display brightness.

In some examples, the orthogonal projection of the storage capacitor Cst, on the base substrate 110, of any other pixel circuit 102 in the plurality of pixel circuits 102 other than the first pixel circuit 102-1, is located within a range of the orthogonal projection of the effective light-emitting region, on the base substrate 110, of the light-emitting device 12 in one of the plurality of light-emitting structures 123 other than the first light-emitting structure 123. Hereinafter, the embodiments of the present disclosure will be described based on the orthogonal projection of the storage capacitor Cst, on the base substrate 110, of any other pixel circuit 102 in the plurality of pixel circuits 102 other than the first pixel circuit 102-1, being located within the range of the orthogonal projection of the effective light-emitting region, on the base substrate 110, of the light-emitting device 12 in one of the plurality of light-emitting structures 123 other than the first light-emitting structure 123.

As shown in FIGS. 7A to 7D, the plurality of light-emitting structures 123 includes the first light-emitting structure, a second light-emitting structure, and a third light-emitting structure. The first light-emitting structure includes the light-emitting device 12-1, the second light-emitting structure includes a light-emitting device 12-2, and the third light-emitting structure includes a light-emitting device 12-3. The plurality of pixel circuits 102 includes the first pixel circuit 102-1, a second pixel circuit 102-2, and a third pixel circuit 102-3. The first pixel circuit 102-1 is coupled to the light-emitting device 12-1, and the first pixel circuit 102-1 includes a storage capacitor Cst-1 and a plurality of transistors TFTs. The second pixel circuit 102-2 is coupled to the light-emitting device 12-2, and the second pixel circuit 102-2 includes a storage capacitor Cst-2 and a plurality of transistors TFTs. The third pixel circuit 102-3 is coupled to the light-emitting device 12-3, and the third pixel circuit 102-3 includes a storage capacitor Cst-3 and a plurality of transistors TFTs.

Figure 7A:
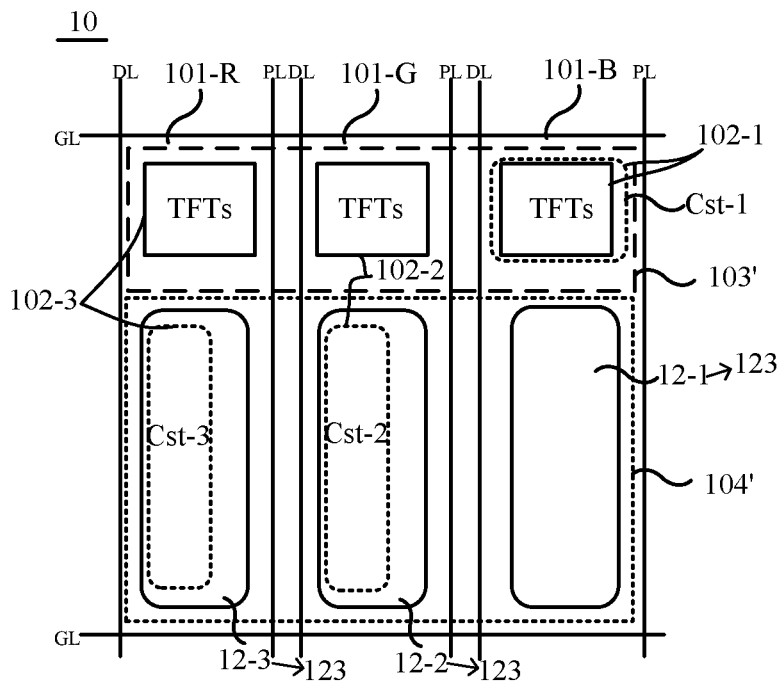
FIG. 7A is a schematic diagram showing arrangement positions of a plurality of transistors and storage capacitors of pixel circuits and light-emitting devices in a pixel region, in accordance with some embodiments of the present disclosure.

In some embodiments, as shown in FIG. 7A, the pixel region 10 includes a non-light-emitting region 103' and a light-emitting region 104'. The plurality of light-emitting structures 123 are located in the light-emitting region 104'. The first pixel circuit 102-1 and the plurality of transistors TFTs of each of other pixel circuits 102 in the plurality of pixel circuits other than the first pixel circuit 102-1 are located in the non-light-emitting region 103'. On this basis, the storage capacitors Cst of the other pixel circuits 102 may be located in the light-emitting region 104'.

In an example where the plurality of light-emitting structures 123 includes the first light-emitting structure, the second light-emitting structure, and the third light-emitting structure, as shown in FIG. 7A, the first light-emitting structure, the second light-emitting structure, and the third light-emitting structure are located in the light-emitting region 104'. The plurality of transistor TFTs of the first pixel circuit 102-1, the plurality of transistor TFTs of the second pixel circuit 102-2, and the plurality of transistor TFTs of the third pixel circuit 102-3 are all located in the non-light-emitting region 103'.

In some examples, as shown in FIG. 7A, an orthogonal projection of the storage capacitor Cst-1 of the first pixel circuit 102-1 on the base substrate 110 is overlapped with orthogonal projections of the plurality of transistors TFTs of the first pixel circuit 102-1 on the base substrate 110.

On this basis, for example, an orthogonal projection of the storage capacitor Cst-2 of the second pixel circuit 102-2 on the base substrate 110 is overlapped with an orthogonal projection of an effective light-emitting region of the light-emitting device 12-2 on the base substrate 110. An orthogonal projection of the storage capacitor Cst-3 of the third pixel circuit 102-3 on the base substrate 110 is overlapped with an orthogonal projection of an effective light-emitting region of the light-emitting device 12-3 on the base substrate 110.

The light-emitting region 104' may include a plurality of sub-light-emitting regions, and the non-light-emitting region 103' may include a plurality of sub-non-light-emitting regions, and each sub-light-emitting region and a corresponding sub-non-light-emitting region are connected to form the sub-pixel region 101.

Based on this, for example, as shown in FIG. 7A, the light-emitting device 12-1 and the first pixel circuit 102-1 are provided in the blue sub-pixel region 101-B, and the orthogonal projection of the storage capacitor Cst-1 located in the blue sub-pixel region 101-B on the base substrate 110 is overlapped with the orthogonal projections of the plurality of transistor TFTs located in the blue sub-pixel region 101-B on the base substrate 110. The light-emitting device 12-2 and the second pixel circuit 102-1 are provided in the green sub-pixel region 101-G, and the orthogonal projection of the storage capacitor Cst-2 located in the green sub-pixel region 101-G on the base substrate 110 is overlapped with the orthogonal projection of the effective light-emitting region of the light-emitting device 12-2 located in the green sub-pixel region 101-G on the base substrate 110. The light-emitting device 12-3 and the third pixel circuit 102-3 are provided in the red sub-pixel region 101-R, and the orthogonal projection of the storage capacitor Cst-3 located in the red sub-pixel region 101-R on the base substrate 110 is overlapped with the orthogonal projection of the effective light-emitting region of the light-emitting device 12-3 located in the red sub-pixel region 101-R on the base substrate 110.

Figure 7B:
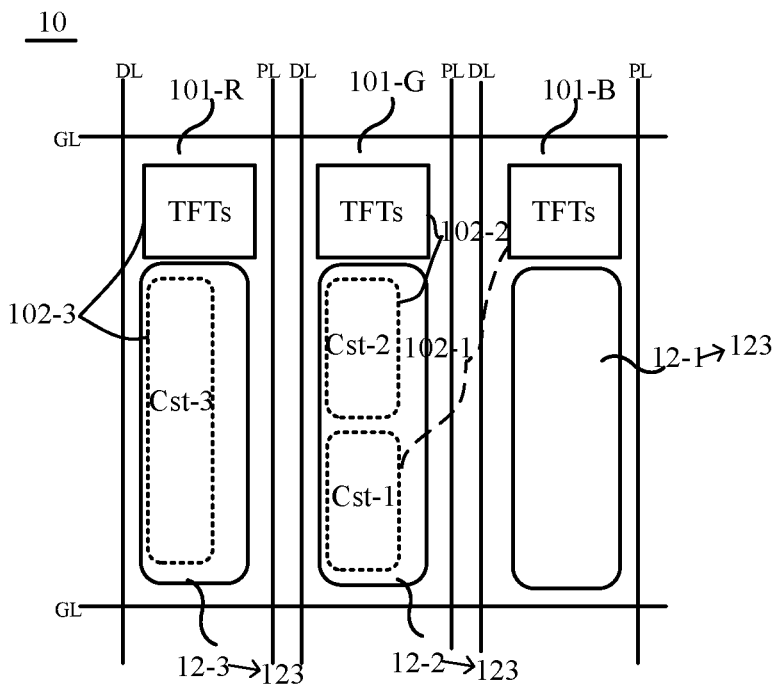
FIG. 7B is another schematic diagram showing arrangement positions of a plurality of transistors and storage capacitors of pixel circuits and light-emitting devices in a pixel region, in accordance with some embodiments of the present disclosure.
Figure 7C:
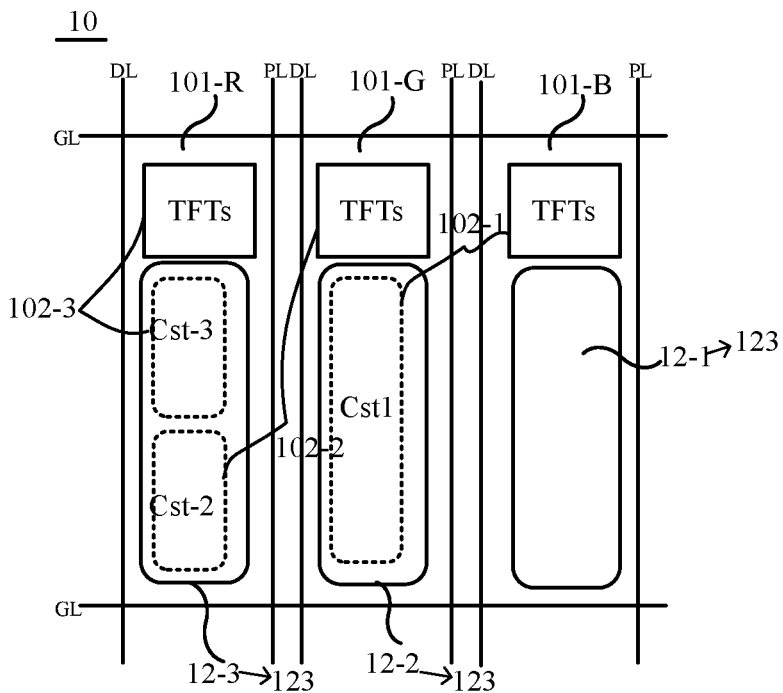
FIG. 7C is yet another schematic diagram showing arrangement positions of a plurality of transistors and storage capacitors of pixel circuits and light-emitting devices in a pixel region, in accordance with some embodiments of the present disclosure.
Figure 7D:
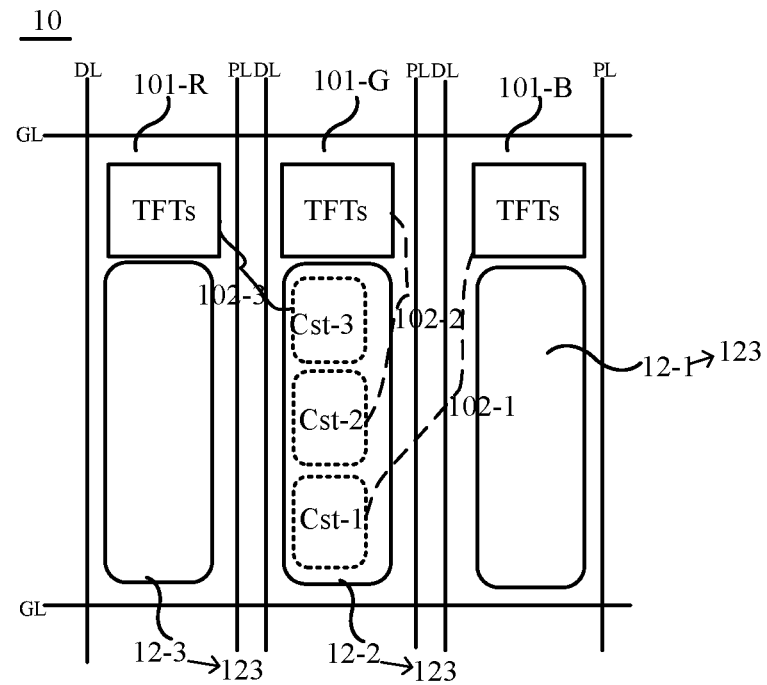
FIG. 7D is yet another schematic diagram showing arrangement positions of a plurality of transistors and storage capacitors of pixel circuits and light-emitting devices in a pixel region, in accordance with some embodiments of the present disclosure.

In some other embodiments, as shown in FIGS. 7B to 7D, the orthogonal projection of the storage capacitor Cst-1 of the first pixel circuit 102-1 on the base substrate 110, is located within the range of the orthogonal projection of the effective light-emitting region, on the base substrate 110, of the light-emitting device 12 in one of the plurality of light-emitting structures 123 other than the first light-emitting structure 123.

In some examples, as shown in FIGS. 7B to 7D, the orthogonal projection of the storage capacitor Cst-1 of the first pixel circuit 102-1 on the base substrate 110, is located within a range of the orthogonal projection of the effective light-emitting region, on the base substrate 110, of the light-emitting device 12-2 coupled to the second pixel circuit 102-2.

In this case, the orthogonal projection of the storage capacitor Cst, on the base substrate 110, of each pixel circuit 102 other than the first pixel circuit 102-1 may be located within the range of the orthogonal projection of the effective light-emitting region, on the base substrate 110, of the light-emitting device 12 coupled to the pixel circuit 102. For example, as shown in FIG. 7B, the orthogonal projection of the storage capacitor Cst-2 of the second pixel circuit 102-2 on the base substrate 110 is located within the range of the orthogonal projection of the effective light-emitting region of the light-emitting device 12-2 on the base substrate 110. The orthogonal projection of the storage capacitor Cst-3 of the third pixel circuit 102-3 on the base substrate 110 is located within a range of the orthogonal projection of the effective light-emitting region of the light-emitting device 12-3 on the base substrate 110.

Or, the orthogonal projections of the storage capacitors Cst, on the base substrate 110, of other pixel circuits 102 other than the first pixel circuit 102-1 are located within the range of the orthogonal projection of the effective light-emitting region, on the base substrate 110, of any light-emitting device 12 other than the light-emitting device 12-1. As shown in FIG. 7C, the orthogonal projections of the storage capacitor Cst-2 of the second pixel circuit 102-2 and the storage capacitor Cst-3 of the third pixel circuit 102-3 on the base substrate 110 are located within the range of the orthogonal projection of the effective light-emitting region of the light-emitting device 12-3 on the base substrate 110.

Of course, the orthogonal projections of the storage capacitor Cst-1 of the first pixel circuit 102-1 and the storage capacitors Cst of other pixel circuits 102 other than the first pixel circuit on the base substrate 110, are located within the range of the orthogonal projection of the effective light-emitting region, on the base substrate 110, of any light-emitting device 12 other than the light-emitting device 12-1. For example, as shown in FIG. 7D, the orthogonal projections of the storage capacitor Cst-1 of the first pixel circuit 102-1, the storage capacitor Cst-2 of the second pixel circuit 102-2, and the storage capacitor Cst-3 of the third pixel circuit 102-3 on the base substrate 110 are located within the range of the orthogonal projection of the effective light-emitting region of the light-emitting device 12-2 on the base substrate 110.

Figure 8:
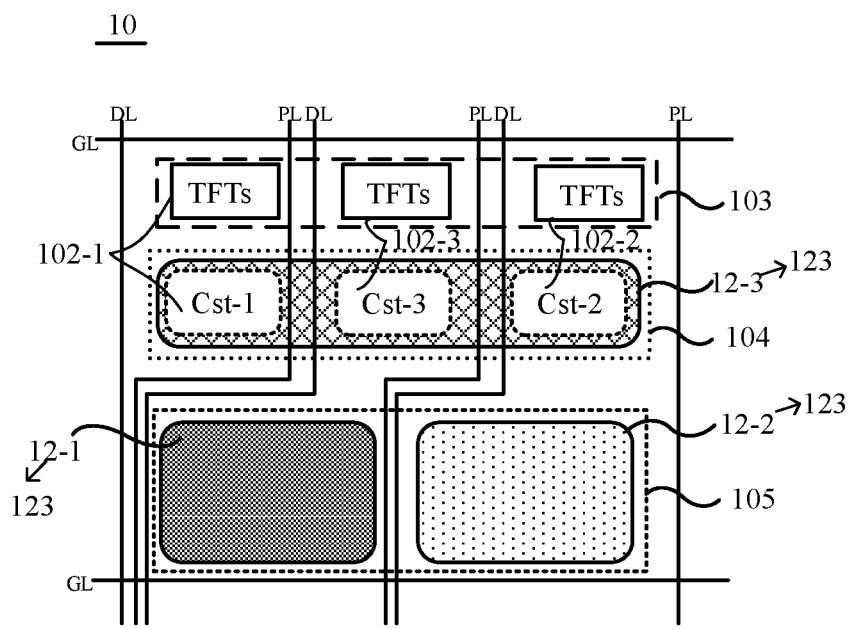
FIG. 8 is yet another schematic diagram showing arrangement positions of a plurality of transistors and storage capacitors of pixel circuits and light-emitting devices in a pixel region, in accordance with some embodiments of the present disclosure.

In yet other embodiments, the orthogonal projection of the storage capacitor Cst-1 of the first pixel circuit 102-1 on the base substrate 110, is located within the range of the orthogonal projection of the effective light-emitting region, on the base substrate 110, of the light-emitting device 12 in one of the plurality of light-emitting structures 123 other than the first light-emitting structure 123. On this basis, as shown in FIG. 8, the pixel region 10 includes a non-light-emitting region 103, a first light-emitting region 104, and a second light-emitting region 105. The first light-emitting region 104 is located between the non-light-emitting region 103 and the second light-emitting region 105. The first light-emitting structure and the second light-emitting structure are located in the second light-emitting region 105, and the third light-emitting structure is located in the first light-emitting region 104. That is, the light-emitting device 12-1 and the light-emitting device 12-2 are located in the second light-emitting region 105, and the light-emitting device 12-3 is located in the first light-emitting region 104. The storage capacitor Cst-1 of the first pixel circuit 102-1 is located in the first light-emitting region 104. The plurality of transistors TFTs of each of the first pixel circuit 102-1, the second pixel circuit 102-2, and the third pixel circuit 102-3 are located in the non-light-emitting region 103.

Figure 9A:
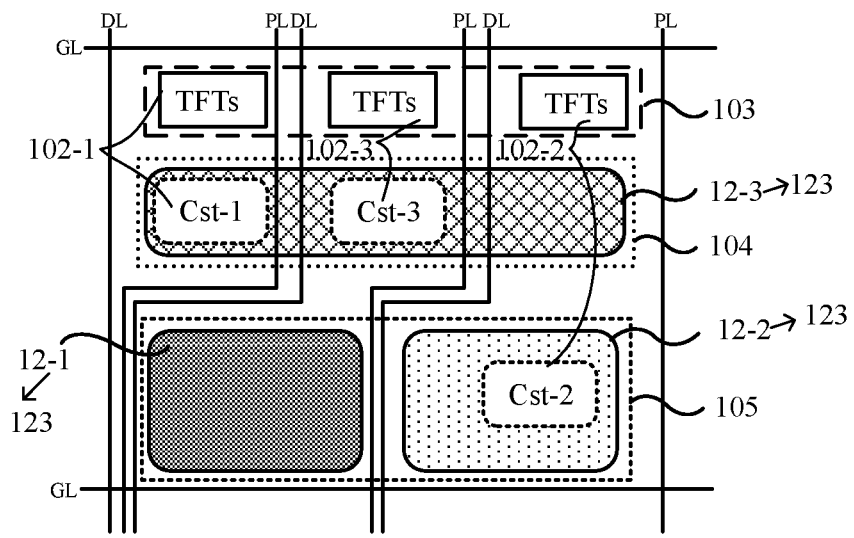
FIG. 9A is yet another schematic diagram showing arrangement positions of a plurality of transistors and storage capacitors of pixel circuits and light-emitting devices in a pixel region, in accordance with some embodiments of the present disclosure.

In this case, for example, as shown in FIG. 9A, the storage capacitor Cst-2 of the second pixel circuit 102-2 is located in the second light-emitting region 105, and the storage capacitor Cst-3 of the third pixel circuit 102-3 is located in the first light-emitting region 104.

Figure 9B:
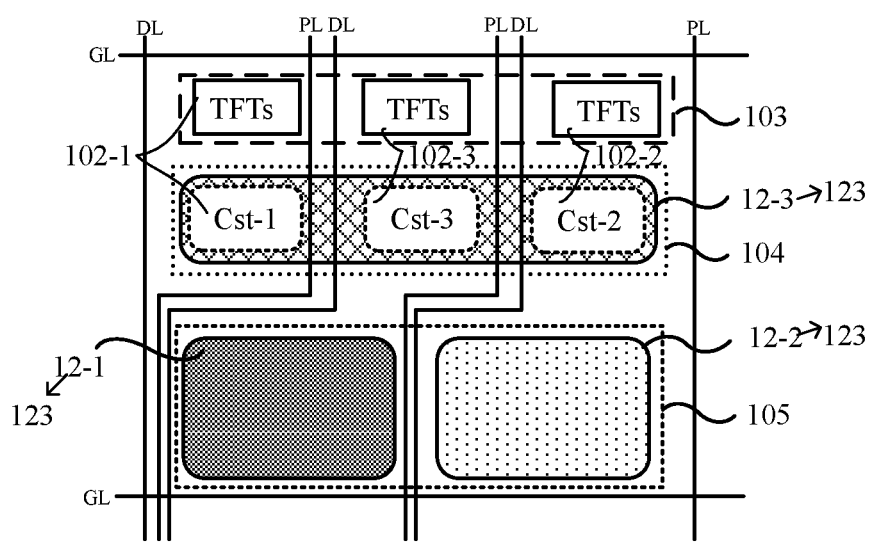
FIG. 9B is yet another schematic diagram showing arrangement positions of a plurality of transistors and storage capacitors of pixel circuits and light-emitting devices in a pixel region, in accordance with some embodiments of the present disclosure.

For another example, as shown in FIG. 9B, both the storage capacitor Cst-2 of the second pixel circuit 102-2 and the storage capacitor Cst-3 of the third pixel circuit 102-3 are located in the first light-emitting region 104.

In a case where the storage capacitor Cst-1, the storage capacitor Cst-2, and the storage capacitor Cst-3 are all located in the first light-emitting region 104, the light-emitting device 12-3 in the third light-emitting structure located in the first light-emitting region 104 has the longest light-emitting wavelength. That is, in the example where the three primary colors are red, green, and blue, respectively, the light-emitting device 12-1 in the first light-emitting structure is configured to emit blue light, the light-emitting device 12-2 in the second light-emitting structure is configured to emit green light, and the light-emitting device 12-3 in the third light-emitting structure is configured to emit red light. In this way, the storage capacitor Cst-1, the storage capacitor Cst-2, and the storage capacitor Cst-3 have little influence on a transmittance of red light, and do not affect transmittances of blue light and green light, thereby minimizing an influence of the storage capacitors on the lifetime of the entire display panel.

Figure 10A:
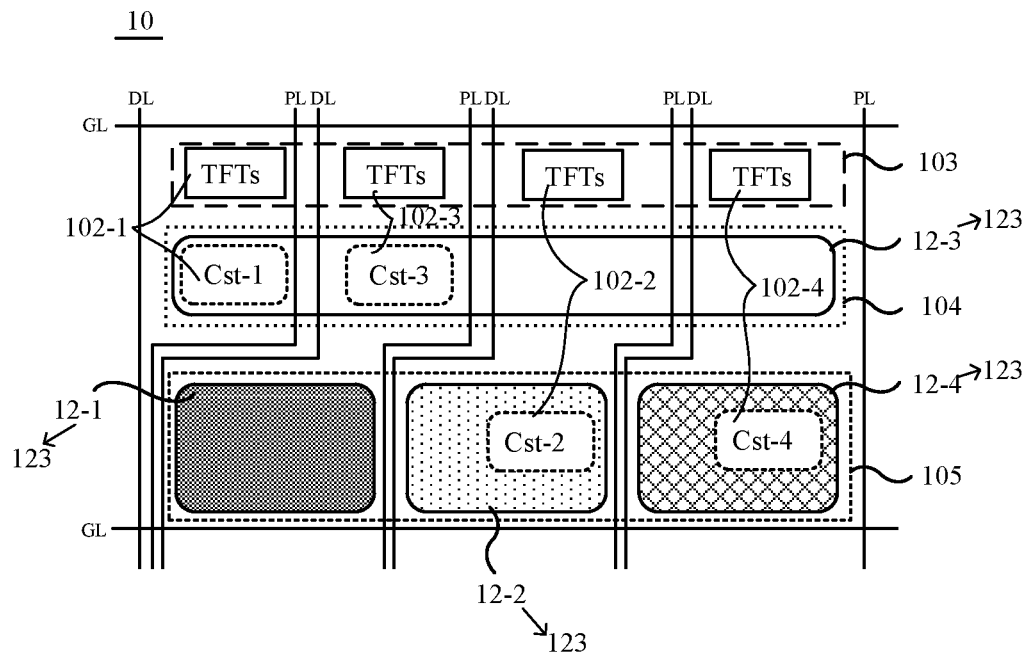
FIG. 10A is yet another schematic diagram showing arrangement positions of a plurality of transistors and storage capacitors of pixel circuits and light-emitting devices in a pixel region, in accordance with some embodiments of the present disclosure.
Figure 10B:
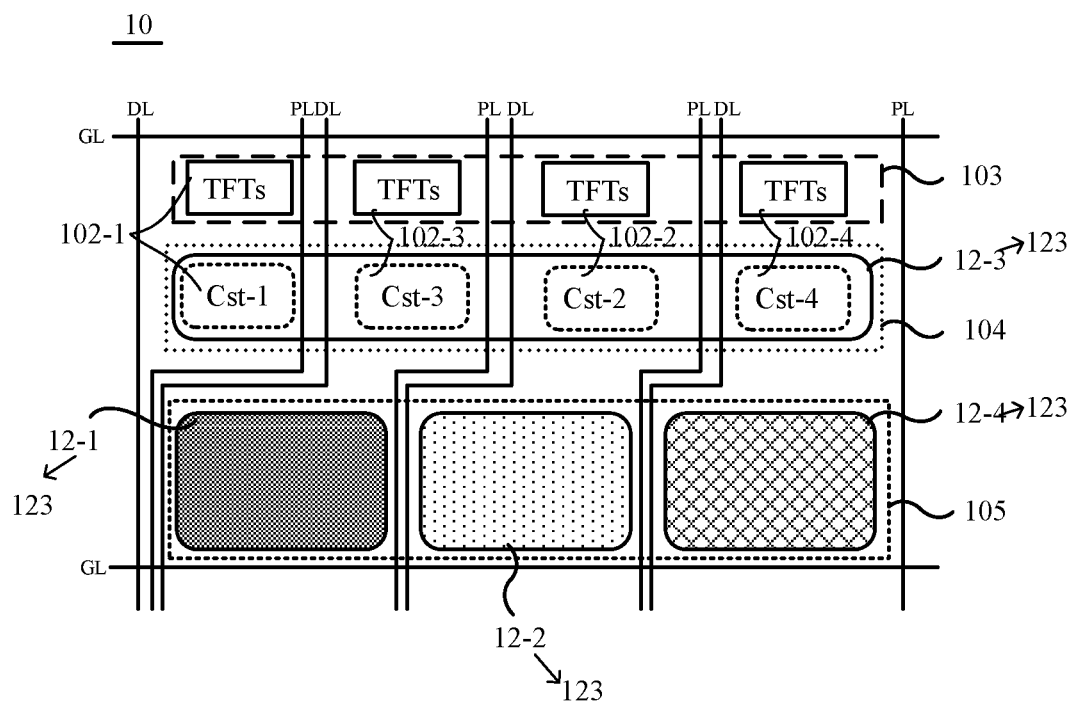
FIG. 10B is yet another schematic diagram showing arrangement positions of a plurality of transistors and storage capacitors of pixel circuits and light-emitting devices in a pixel region, in accordance with some embodiments of the present disclosure.

Based on the above, in some examples, as shown in FIGS. 10A and 10B, the plurality of light-emitting structures 123 further include a fourth light-emitting structure having a light-emitting device 12-4 in addition to the first light-emitting structure, the second light-emitting structure, and the third light-emitting structure. The first light-emitting structure, the second light-emitting structure, and the fourth light-emitting structure are configured to emit the light of three primary colors, and the third light-emitting structure is configured to emit white light. The plurality of pixel circuits 102 further includes a fourth pixel circuit 102-4 in addition to the first pixel circuit 102-1, the second pixel circuit 102-2, and the third pixel circuit 102-3. The fourth pixel circuit 102-4 is coupled to the light-emitting device 12-4 in the fourth light-emitting structure. The first light-emitting structure (i.e., the light-emitting device 12-1), the second light-emitting structure (i.e., the light-emitting device 12-2), and the fourth light-emitting structure (i.e., the light-emitting device 12-4) are located in the second light-emitting region 105, and the third light-emitting structure (i.e., the light-emitting device 12-3) is located in the first light-emitting region 104. The storage capacitor Cst-1 of the first pixel circuit 102-1 is located in the first light-emitting region 104. The plurality of transistors TFTs of each of the first pixel circuit 102-1, the second pixel circuit 102-2, the third pixel circuit 102-3, and the fourth pixel circuit 102-4 are located in the non-light-emitting region 103.

In this case, for example, as shown in FIG. 10A, the storage capacitor Cst-3 of the third pixel circuit 102-3 is located in the first light-emitting region 104, and the storage capacitor Cst-2 of the second pixel circuit 102-2 and the storage capacitor Cst-4 of the fourth pixel circuit 102-4 are located in the second light-emitting region 105.

For another example, as shown in FIG. 10B, the storage capacitor Cst-1 of the first pixel circuit 102-1, the storage capacitor Cst-2 of the second pixel circuit 102-2, the storage capacitor Cst-3 of the third pixel circuit 102-3, and the storage capacitor Cst-4 of the fourth pixel circuit 102-4 are located in the first light-emitting region 104. In this way, the orthogonal projections of the storage capacitor Cst-1 of the first pixel circuit 102-1, the storage capacitor Cst-2 of the second pixel circuit 102-2, the storage capacitor Cst-3 of the third pixel circuit 102-3, and the storage capacitor Cst-4 of the fourth pixel circuit 102-4 on the base substrate 110 are located within the range of the orthogonal projection of the effective light-emitting region of the light-emitting device 12-3 in the third light-emitting structure on the base substrate 110. Therefore, the storage capacitor Cst-1, the storage capacitor Cst-2, the storage capacitor Cst-3, and the storage capacitor Cst-4 do not affect the transmittance of the light of three primary colors emitted from the light-emitting device 12-1, the light-emitting device 12-2, and the light-emitting device 12-4, which is beneficial to prolong the lifetimes of the light-emitting device 12-1, the light-emitting device 12-2, and the light-emitting device 12-4.

Figure 11A:
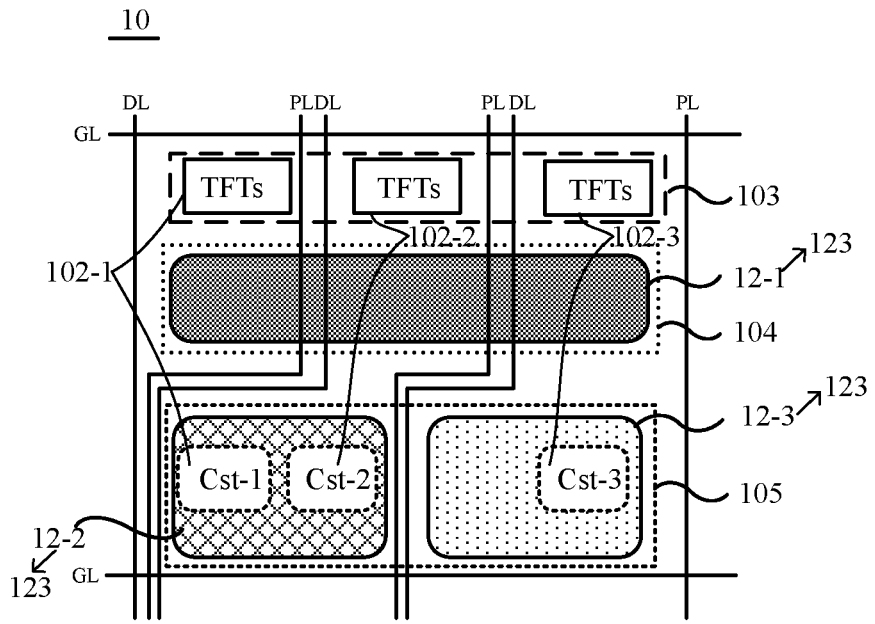
FIG. 11A is yet another schematic diagram showing arrangement positions of a plurality of transistors and storage capacitors of pixel circuits and light-emitting devices in a pixel region, in accordance with some embodiments of the present disclosure.

In some other examples, as shown in FIG. 11A, the pixel region 10 includes a non-light-emitting region 103, a first light-emitting region 104, and a second light-emitting region 105. The first light-emitting region 104 is located between the non-light-emitting region 103 and the second light-emitting region 105. The first light-emitting structure (i.e., the light-emitting device 12-1) is located in the first light-emitting region 104, and both the second light-emitting structure (i.e., the light-emitting device 12-2) and the third light-emitting structure (i.e., the light-emitting device 12-3) are located in the second light-emitting region 105. The storage capacitor Cst-1 of the first pixel circuit 102-1, the storage capacitor Cst-2 of the second pixel circuit 102-2, and the storage capacitor Cst-3 of the third pixel circuit 102-3 are located in the second light-emitting region 105. The plurality of transistors TFTs of each of the first pixel circuit 102-1, the second pixel circuit 102-2, and the third pixel circuit 102-3 are located in the non-light-emitting region 103.

In this case, for example, as shown in FIG. 11A, the orthogonal projection of the storage capacitor Cst-1 of the first pixel circuit 102-1 on the base substrate 110 is located within the range of the orthogonal projection of the effective light-emitting region of the light-emitting device 12-2 in the second light-emitting structure on the base substrate 110. On this basis, the orthogonal projection of the storage capacitor Cst-2 of the second pixel circuit 102-2 on the base substrate 110 may also be located within the range of the orthogonal projection of the effective light-emitting region of the light-emitting device 12-2 in the second light-emitting structure on the base substrate 110. The orthogonal projection of the storage capacitor Cst-3 of the third pixel circuit 102-3 on the base substrate 110 may be located within the range of the orthogonal projection of the effective light-emitting region of the light-emitting device 12-3 in the third light-emitting structure on the base substrate 110.

Figure 11B:
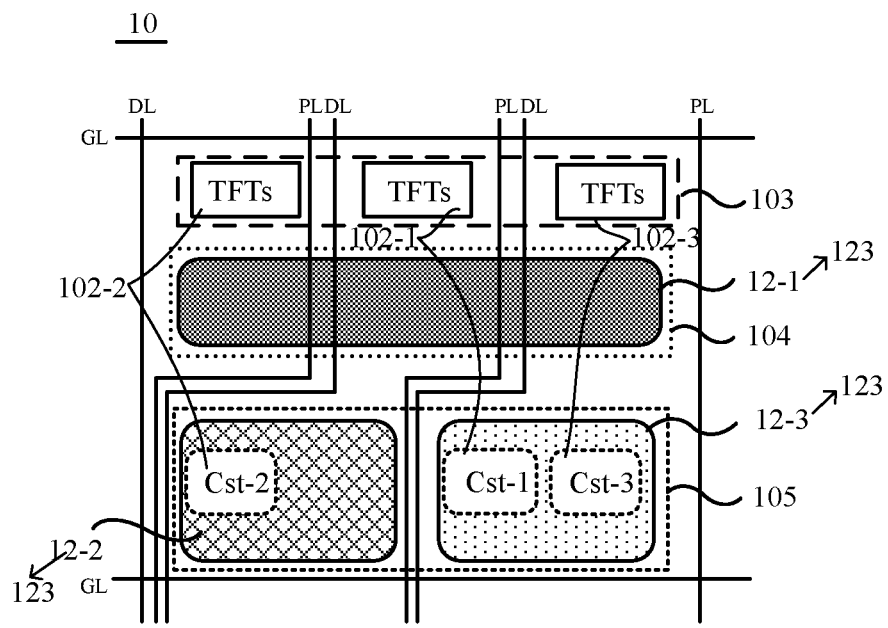
FIG. 11B is yet another schematic diagram showing arrangement positions of a plurality of transistors and storage capacitors of pixel circuits and light-emitting devices in a pixel region, in accordance with some embodiments of the present disclosure.

For another example, as shown in FIG. 11B, the orthogonal projection of the storage capacitor Cst-1 of the first pixel circuit 102-1 on the base substrate 110 is located within the range of the orthogonal projection of the effective light-emitting region of the light-emitting device 12-3 in the third light-emitting structure on the base substrate 110. The orthogonal projection of the storage capacitor Cst-3 of the third pixel circuit 102-3 on the base substrate 110 may also be located within the range of the orthogonal projection of the effective light-emitting region of the light-emitting device 12-3 in the third light-emitting structure on the base substrate 110. The orthogonal projection of the storage capacitor Cst-2 of the second pixel circuit 102-2 on the base substrate 110 may be located within the range of the orthogonal projection of the effective light-emitting region of the light-emitting device 12-2 in the second light-emitting structure on the base substrate 110.

Figure 12:
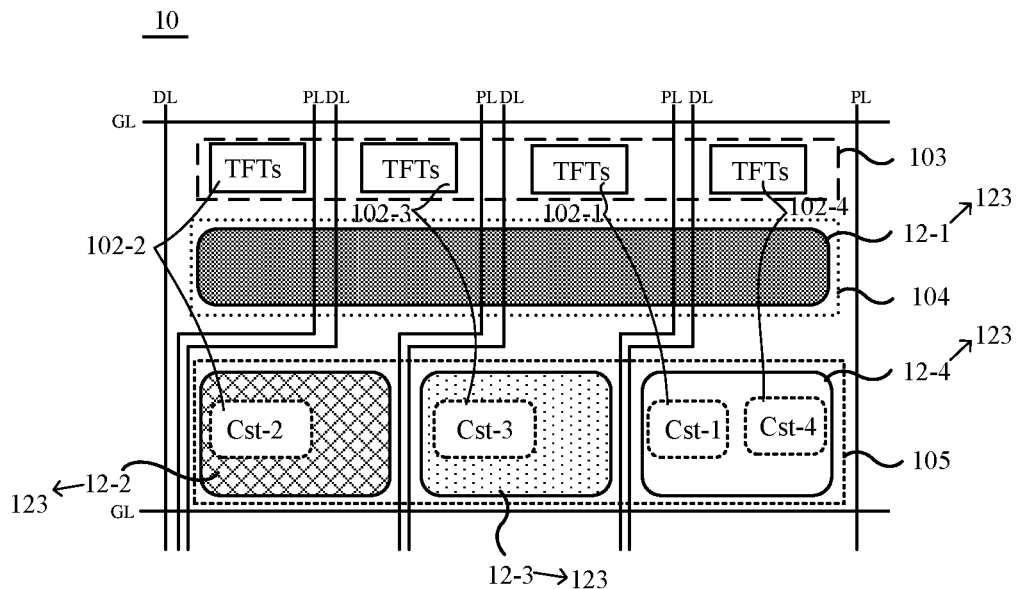
FIG. 12 is yet another schematic diagram showing arrangement positions of a plurality of transistors and storage capacitors of pixel circuits and light-emitting devices in a pixel region, in accordance with some embodiments of the present disclosure.

Based on the above, in some examples, as shown in FIG. 12, the plurality of light-emitting structures 123 further include a fourth light-emitting structure having a light-emitting device 12-4 in addition to the first light-emitting structure, the second light-emitting structure, and the third light-emitting structure. The first light-emitting structure, the second light-emitting structure, and the third light-emitting structure are configured to emit the light of three primary colors, and the fourth light-emitting structure is configured to emit white light. The plurality of pixel circuits 102 further include a fourth pixel circuit 102-4 in addition to the first pixel circuit 102-1, the second pixel circuit 102-2, and the third pixel circuit 102-3. The fourth pixel circuit 102-4 is coupled to the light-emitting device 12-4 in the fourth light-emitting structure. The first light-emitting structure (i.e., the light-emitting device 12-1) is located in the first light-emitting region 104, and both the second light-emitting structure (i.e., the light-emitting device 12-2) and the third light-emitting structure (i.e., the light-emitting device 12-3) are located in the second light-emitting region 105. The storage capacitor Cst-1 of the first pixel circuit 102-1, the storage capacitor Cst-2 of the second pixel circuit 102-2, and the storage capacitor Cst-3 of the third pixel circuit 102-3 are located in the second light-emitting region 105. The fourth light-emitting structure (i.e., the light-emitting device 12-4) and the storage capacitor Cst-4 of the fourth pixel circuit 102-4 are located in the second light-emitting region 105. The plurality of transistors TFTs of each of the first pixel circuit 102-1, the second pixel circuit 102-2, the third pixel circuit 102-3, and the fourth pixel circuit 102-4 are located in the non-light-emitting region 103.

In this case, for example, as shown in FIG. 12, the orthogonal projection of the storage capacitor Cst-1 of the first pixel circuit 102-1 on the base substrate 110 is located within a range of an orthogonal projection of an effective light-emitting region of the light-emitting device 12-4 in the fourth light-emitting structure on the base substrate 110. On this basis, an orthogonal projection of the storage capacitor Cst-4 of the fourth pixel circuit 102-4 on the base substrate 110 is located within the range of the orthogonal projection of the effective light-emitting region of the light-emitting device 12-4 in the fourth light-emitting structure on the base substrate 110. The orthogonal projection of the storage capacitor Cst-2 of the second pixel circuit 102-2 on the base substrate 110 is located within the range of the orthogonal projection of the effective light-emitting region of the light-emitting device 12-2 in the second light-emitting structure on the base substrate 110. The orthogonal projection of the storage capacitor Cst-3 of the third pixel circuit 102-3 on the base substrate 110 is located within the range of the orthogonal projection of the effective light-emitting region of the light-emitting device 12-3 in the third light-emitting structure on the base substrate 110.

In this way, an influence of the storage capacitor Cst-1 of the first pixel circuit 102-1 on the transmittance of the light of three primary colors emitted from the light-emitting device 12-1, the light-emitting device 12-2, and the light-emitting device 12-3 may be avoided, thereby preventing the storage capacitors from reducing the lifetimes of the light-emitting device 12-1, the light-emitting device 12-2, and the light-emitting device 12-3.

In some embodiments, as shown in FIG. 3B, each light-emitting structure 123 includes the light-emitting device 12 and a filter portion 13 disposed on a light exit surface side of the light-emitting device 12. In this way, the light-emitting device 12-1 in the first light-emitting structure is configured to emit white light, and the filter portion 13 in the first light-emitting structure is configured to transmit blue light. In addition, the light-emitting devices 12 in other light-emitting structures 123 other than the first light-emitting structure may also be configured to emit white light. Accordingly, the filter portion 13 in the light-emitting structure 123 configured to emit red light is configured to transmit red light, and the filter portion 13 in the light-emitting structure 123 configured to emit green light is configured to transmit green light.

In some embodiments, the storage capacitor Cst may include at least two transparent electrode layers.

Figure 13A:
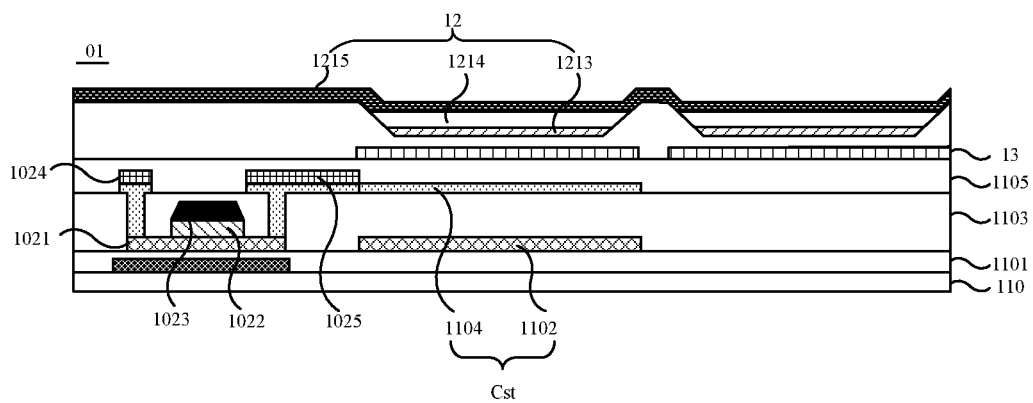
FIG. 13A is a sectional view of a display panel, in accordance with some embodiments of the present disclosure.
Figure 13B:
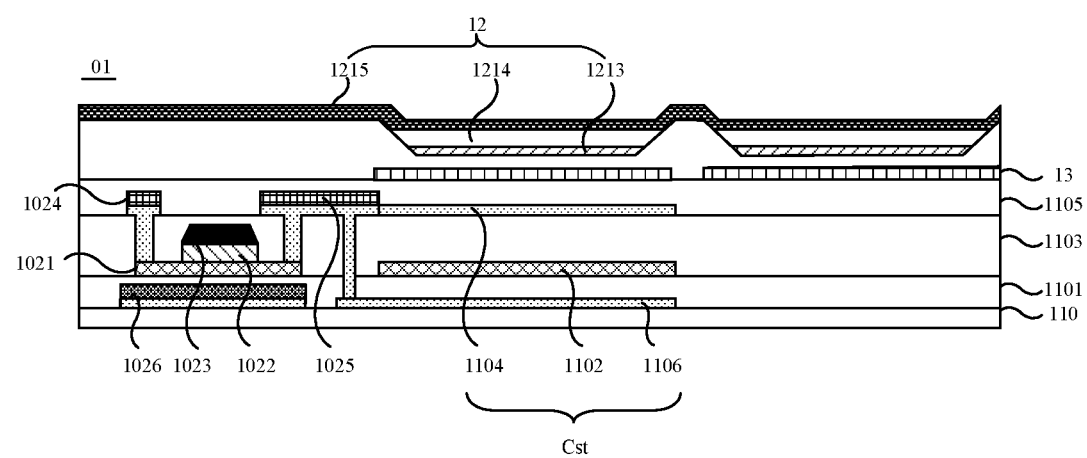
FIG. 13B is a sectional view of another display panel, in accordance with some embodiments of the present disclosure.

In some embodiments, as shown in FIGS. 13A and 13B, the storage capacitor Cst includes a first transparent electrode layer 1102 and a second transparent electrode layer 1104 that are insulated from each other. The first transparent electrode layer 1102 is closer to the base substrate 110 than the second transparent electrode layer 1104. An interlayer dielectric (ILD) layer 1103 is further provided between the first transparent electrode layer 1102 and the second transparent electrode layer 1104.

As shown in FIGS. 13A and 13B, each transistor includes an active layer 1021, a gate 1023, a source 1024, and a drain 1025. For example, the gate 1023 is formed on a side of the active layer 1021 away from the base substrate 110. The transistor further includes a gate insulating block 1022 and a portion of the interlayer dielectric layer 1103 located in a region where the transistor is located. The source 1024 and the drain 1025 are coupled to the active layer 1021 through vias in the interlayer dielectric layer 1103.

A material of the active layer 1021 includes a semiconductor material. The first transparent electrode layer 1102 of the storage capacitor Cst and the active layer(s) 1021 of at least one transistor are arranged in a same layer, and the first transparent electrode layer 1102 is obtained by conducting the semiconductor material.

Here, the same layer means that a film for forming a specific pattern is formed by using the same film forming process, and then is patterned by the same patterning process using the same mask to form a layer structure. Depending on different specific patterns, the same patterning process may include exposure, development and etching processes. The specific pattern in the formed layer structure may be continuous or discontinuous, and these specific patterns may also be at different heights or have different thicknesses. A conducting process may be, for example, an ion implantation process.

In this way, the first transparent electrode layer 1102 and the active layer 1021 may be formed by one patterning process, which is beneficial to simplify the process flow and reduce the production cost.

For example, the semiconductor material is at least one of indium gallium zinc oxide (IGZO), indium zinc tin oxide (IZTO), and zinc oxide (ZnO).

In some examples, as shown in FIGS. 13A and 13B, the second transparent electrode layer 1104 of the storage capacitor Cst is coupled to the drain 1025 of the transistor, and the first transparent electrode layer 1102 of the storage capacitor Cst is coupled to the gate 1023 of the transistor through other via(s) in the interlayer dielectric layer 1103 (not shown in the figures).

In some examples, as shown in FIGS. 13A and 13B, each of the source 1024 and the drain 1025 includes a first sub-electrode and a second sub-electrode that are sequentially stacked in the thickness direction of the base substrate 110. The first sub-electrode is made of a transparent conductive material, and the second sub-electrode is made of a metal material. In this case, the second sub-electrodes of the source 1024 and the drain 1025 and the second transparent electrode layer 1104 may be arranged in a same layer.

In this way, a transparent conductive film and a metal film may be sequentially deposited on the base substrate 110, and the source 1024, the drain 1025, and the second transparent electrode layer 1104 may be manufactured by one patterning using a half-exposure process, thereby simplifying the manufacturing process and reducing the production cost.

For example, the second sub-electrode is a copper/molybdenum niobium (Cu/MoNb) or molybdenum/aluminum (Mo/Al) laminated structure. The first sub-electrode and the second transparent electrode layer 1104 are made of at least one of indium tin oxide (ITO), indium gallium zinc oxide (IGZO), and indium zinc oxide (IZO).

In some examples, as shown in FIGS. 13A and 13B, the light-emitting device 12 includes the anode 1213, the cathode 1215, and a light-emitting functional layer 1214. For example, the light-emitting functional layer 1214 includes a hole injection layer, a hole transport layer, a light-emitting layer, an electron transport layer, and an electron injection layer that are sequentially stacked. The anode 1213 is made of a transparent material, and the cathode 1215 is made of an opaque metal.

In some examples, as shown in FIGS. 13A and 13B, a buffer layer 1101 is provided between the base substrate 110 and the first transparent electrode layer 1102.

In some examples, as shown in FIGS. 13A and 13B, a passivation (PVX) layer 1105 is provided between the second transparent electrode layer 1104 and the filter portion 13. Both the buffer layer 1101 and the passivation layer 1105 may be made of a transparent insulating material. For example, the transparent insulating material is silicon oxide ($SiO_x$), silicon nitride ($SiN_x$), etc.

In some embodiments, in order to increase a capacitance of the storage capacitor Cst, as shown in FIG. 13B, the storage capacitor Cst further includes a third transparent electrode layer 1106. The third transparent electrode layer 1106 is closer to the base substrate 110 than the first transparent electrode layer 1102. The third transparent electrode layer 1106 is insulated from the first transparent electrode layer 1102, and is coupled to the second transparent electrode layer 1104.

In some examples, as shown in FIGS. 13A and 13B, the display panel 01 further includes a plurality of light shielding portions 1026. Each light shielding portion 1026 is located on a side of the active layer 1021 of the transistor facing the base substrate 110. The light shielding portion 1026 may prevent ambient light from entering the active layer 1021 of the transistor, thereby preventing the ambient light from reducing the reliability of the transistor, which is beneficial to ensure the stability of the transistor.

For example, as shown in FIGS. 13A and 13B, the light shielding portion 1026 includes a transparent conductive sub-portion and a metal sub-portion that are stacked in the thickness direction of the base substrate 110. The third transparent electrode layer 1106 and the transparent conductive sub-portion are arranged in a same layer. Both the third transparent electrode layer 1106 and the light shielding portion 1026 may be located between the buffer layer 1101 and the base substrate 110. In this way, a transparent conductive film and a metal film may be sequentially deposited on the base substrate 110, and the third transparent electrode layer 1106 and the light shielding portion 1026 may be formed by one patterning using a half-exposure process, which is beneficial to simplify the process flow and reduce the production cost.

For example, the third transparent electrode layer 1106 is made of at least one of indium tin oxide (ITO), indium gallium zinc oxide (IGZO), and indium zinc oxide (IZO).

The foregoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a pixel region, the display panel comprising:
    a base substrate;
    a plurality of pixel circuits disposed on the base substrate and located in the pixel region, each pixel circuit including a storage capacitor and a plurality of transistors; and
    a plurality of light-emitting structures disposed in the pixel region and located on a side of the plurality of pixel circuits away from the base substrate; the plurality of light-emitting structures being configured to emit light of at least three primary colors; each light-emitting structure including a light-emitting device, each pixel circuit being coupled to the light-emitting device in a corresponding light-emitting structure, and a surface of the light-emitting device proximate to the base substrate being a light exit surface, wherein
    among the plurality of light-emitting structures, an orthogonal projection of an effective light-emitting region, on the base substrate, of the light-emitting device in a first light-emitting structure with a shortest light-emitting wavelength, is spaced apart from orthogonal projections of all storage capacitors of the plurality of pixel circuits on the base substrate;
    an orthogonal projection of the storage capacitor, on the base substrate, of any other pixel circuit in the plurality of pixel circuits other than a first pixel circuit coupled to the light-emitting device in the first light-emitting structure, is at least partially overlapped with at least one orthogonal projection of at least one effective light-emitting region, on the base substrate, of at least one light-emitting device in at least one of the plurality of light-emitting devices other than the first light-emitting structure, wherein the orthogonal projection of the storage capacitor, on the base substrate, of the any other pixel circuit in the plurality of pixel circuits other than the first pixel circuit, is located within a range of an orthogonal projection of an effective light-emitting region, on the base substrate, of the light-emitting device in one of the plurality of light-emitting structures other than the first light-emitting structure; and
    an orthogonal projection of the storage capacitor of the first pixel circuit on the base substrate, is located within the range of the orthogonal projection of the effective light-emitting region, on the base substrate, of the light-emitting device in the one of the plurality of light-emitting structures other than the first light-emitting structure.

2. The display panel according to claim 1, wherein the pixel region includes a non-light-emitting region, a first light-emitting region, and a second light-emitting region; the first light-emitting region is located between the non-light-emitting region and the second light-emitting region;
    the plurality of light-emitting structures further include a second light-emitting structure and a third light-emitting structure in addition to the first light-emitting structure; the plurality of pixel circuits further include a second pixel circuit and a third pixel circuit in addition to the first pixel circuit, the second pixel circuit being coupled to the light-emitting device in the second light-emitting structure, and the third pixel circuit being coupled to the light-emitting device in the third light-emitting structure;
    the first light-emitting structure and the second light-emitting structure are located in the second light-emitting region, and the third light-emitting structure is located in the first light-emitting region; the storage capacitor of the first pixel circuit is located in the first light-emitting region; and
    the plurality of transistors of each of the first pixel circuit, the second pixel circuit, and the third pixel circuit are located in the non-light-emitting region.

3. The display panel according to claim 2, wherein the storage capacitor of the second pixel circuit is located in the second light-emitting region, and the storage capacitor of the third pixel circuit is located in the first light-emitting region.

4. The display panel according to claim 2, wherein both the storage capacitor of the second pixel circuit and the storage capacitor of the third pixel circuit are located in the first light-emitting region.

5. The display panel according to claim 2, wherein the plurality of light-emitting structures further include a fourth light-emitting structure, the first light-emitting structure, the second light-emitting structure, and the fourth light-emitting structure being configured to emit light of three primary colors, and the third light-emitting structure being configured to emit white light; the plurality of pixel circuits further include a fourth pixel circuit, the fourth pixel circuit being coupled to the light-emitting device in the fourth light-emitting structure; and
    the fourth light-emitting structure is located in the second light-emitting region, and the plurality of transistors of the fourth pixel circuit are located in the non-light-emitting region.

6. The display panel according to claim 5, wherein the storage capacitor of the third pixel circuit is located in the first light-emitting region; and
    the storage capacitor of the second pixel circuit and the storage capacitor of the fourth pixel circuit are located in the second light-emitting region.

7. The display panel according to claim 5, wherein the storage capacitor of the second pixel circuit, the storage capacitor of the third pixel circuit, and the storage capacitor of the fourth pixel circuit are located in the first light-emitting region.

8. The display panel according to claim 1, wherein the pixel region includes a non-light-emitting region, a first light-emitting region, and a second light-emitting region; the first light-emitting region is located between the non-light-emitting region and the second light-emitting region;
    the plurality of light-emitting structures further include a second light-emitting structure and a third light-emitting structure in addition to the first light-emitting structure; the plurality of pixel circuits further include a second pixel circuit and a third pixel circuit in addition to the first pixel circuit, the second pixel circuit being coupled to the light-emitting device in the second light-emitting structure, and the third pixel circuit being coupled to the light-emitting device in the third light-emitting structure;

the first light-emitting structure is located in the first light-emitting region, and both the second light-emitting structure and the third light-emitting structure are located in the second light-emitting region; the storage capacitor of the first pixel circuit, the storage capacitor of the second pixel circuit, and the storage capacitor of the third pixel circuit are located in the second light-emitting region; and the plurality of transistors of each of the first pixel circuit, the second pixel circuit, and the third pixel circuit are located in the non-light-emitting region.

9. The display panel according to claim 8, wherein the plurality of light-emitting structures further include a fourth light-emitting structure, the first light-emitting structure, the second light-emitting structure, the third light-emitting structure being configured to emit light of three primary colors, and the fourth light-emitting structure being configured to emit white light; the plurality of pixel circuits further include a fourth pixel circuit, the fourth pixel circuit being coupled to the light-emitting device in the fourth light-emitting structure; and the fourth light-emitting structure and the storage capacitor of the fourth pixel circuit are located in the second light-emitting region; the plurality of transistors of the fourth pixel circuit are located in the non-light-emitting region.

10. The display panel according to claim 1, wherein the first light-emitting structure is configured to emit blue light; or, each light-emitting structure further includes a filter portion disposed on the light exit surface of the light-emitting device; the light-emitting device in the first light-emitting structure is configured to emit white light, and the filter portion in the first light-emitting structure is configured to transmit blue light.

11. The display panel according to claim 1, wherein the storage capacitor includes a first transparent electrode layer and a second transparent electrode layer that are insulated from each other; the first transparent electrode layer is closer to the base substrate than the second transparent electrode layer;

each transistor includes an active layer, and a material of the active layer includes a semiconductor material; the first transparent electrode layer of the storage capacitor and at least one active layer of at least one transistor are arranged in a same layer, and the first transparent electrode layer is obtained by conducting the semiconductor material.

12. The display panel according to claim 11, wherein the storage capacitor further includes a third transparent electrode layer; the third transparent electrode layer is closer to the base substrate than the first transparent electrode layer; the third transparent electrode layer and the first transparent electrode layer are insulated from each other; the third transparent electrode layer is coupled to the second transparent electrode layer.

13. The display panel according to claim 12, wherein the display panel further comprises a plurality of light shielding portions; each light-shielding portion is located on a side of the active layer of the transistor facing the base substrate.

14. The display panel according to claim 13, wherein the light shielding portion includes a transparent conductive sub-portion and a metal sub-portion that are stacked in a thickness direction of the base substrate; the third transparent electrode layer and the transparent conductive sub-portion are arranged in a same layer.

15. A display apparatus, comprising the display panel according to claim 1.

16. A display panel having a pixel region, the display panel comprising:
a base substrate;
a plurality of pixel circuits disposed on the base substrate and located in the pixel region, each pixel circuit including a storage capacitor and a plurality of transistors; and
a plurality of light-emitting structures disposed in the pixel region and located on a side of the plurality of pixel circuits away from the base substrate; the plurality of light-emitting structures being configured to emit light of at least three primary colors; each light-emitting structure including a light-emitting device, each pixel circuit being coupled to the light-emitting device in a corresponding light-emitting structure, and a surface of the light-emitting device proximate to the base substrate being a light exit surface, wherein
among the plurality of light-emitting structures, an orthogonal projection of an effective light-emitting region, on the base substrate, of the light-emitting device in a first light-emitting structure with a shortest light-emitting wavelength, is spaced apart from orthogonal projections of all storage capacitors of the plurality of pixel circuits on the base substrate;
an orthogonal projection of the storage capacitor, on the base substrate, of any other pixel circuit in the plurality of pixel circuits other than a first pixel circuit coupled to the light-emitting device in the first light-emitting structure, is at least partially overlapped with at least one orthogonal projection of at least one effective light-emitting region, on the base substrate, of at least one light-emitting device in at least one of the plurality of light-emitting devices other than the first light-emitting structure, wherein the orthogonal projection of the storage capacitor, on the base substrate, of the any other pixel circuit in the plurality of pixel circuits other than the first pixel circuit, is located within a range of an orthogonal projection of an effective light-emitting region, on the base substrate, of the light-emitting device in one of the plurality of light-emitting structures other than the first light-emitting structure; and
the pixel region includes a non-light-emitting region and a light-emitting region; the plurality of light-emitting structures are located in the light-emitting region; the first pixel circuit and the plurality of transistors of each of other pixel circuits in the plurality of pixel circuits other than the first pixel circuit are located in the non-light-emitting region.

17. The display panel according to claim 16, wherein an orthogonal projection of the storage capacitor of the first pixel circuit on the base substrate is at least partially overlapped with orthogonal projections of the plurality of transistors of the first pixel circuit on the base substrate.

* * * * *